United States Patent [19]

Katsuura et al.

[11] Patent Number: 4,530,615

[45] Date of Patent: Jul. 23, 1985

[54] LOCKING AND RELEASING DEVICE FOR USE WITH A PANEL PLATE

[75] Inventors: Nobuo Katsuura, Yokohama; Takashi Furusawa, Tokyo, both of Japan

[73] Assignee: Nikko Kogyo Kabushiki Kaisha, Tokyo, Japan

[21] Appl. No.: 627,276

[22] Filed: Jul. 2, 1984

[51] Int. Cl.³ .............................................. F16D 1/00
[52] U.S. Cl. ..................................... 403/16; 403/321; 16/112
[58] Field of Search .............. 403/16, 157, 158, 159, 403/154, 11, 12, 161, 163, 321; 16/DIG. 13, 380, 112, 115

[56] References Cited

U.S. PATENT DOCUMENTS 3,711,134  1/1973  Goldberg ........................... 403/159
3,878,736  4/1975  Main et al. ........................ 74/523 X
4,261,076  4/1981  Clemens ............................ 16/115 X Primary Examiner—Andrew V. Kundrat
Attorney, Agent, or Firm—Martin Smolowitz

[57] ABSTRACT

Device for locking a panel plate to a housing and releasing it therefrom is comprised a saddle body including a saddle seat and a pair of parallel leg plates extending therefrom. Each of the leg plates has an aperture bored at a portion remote from the seat, and a pin which is made integral with one leg plate by means of a plurality of thin film strips extends outwardly from the periphery of the aperture in that plate in a direction normal thereto. After positioning the panel plate between the leg plates and bringing the apertures in the leg plates into alignment with the aperture bored in the corner of front side of the panel plate, the pin is driven into the apertures, whereupon the device is pivotally attached to the panel plate.

4 Claims, 7 Drawing Figures

LOCKING AND RELEASING DEVICE FOR USE WITH A PANEL PLATE

BACKGROUND OF THE INVENTION

The present invention relates to a locking and releasing device for use with a panel plate. More particularly, the invention relates to a device that is attached to the two corners of one side of a panel plate for assisting its insertion into or removal from a housing or rack. The panel plate inserted is securely fixed in the housing along the channels or ducts in the open end of the housing. The device may also be used to release the inserted panel from the open end of said housing.

1. Field of the Invention

The panel plate, also called a panel board, is a rigid card-like structure. An electric circuit is printed on one or both sides of the plate and electronic parts such as resistors, capacitors and semiconductor devices are mounted on said circuit. The panel plate is a member of an electronic apparatus and has printed thereon a program necessary for the operation of said apparatus. A plurality of such panel plates are arranged parallel and closely spaced in a housing or rack. The bottom or rear end of the housing or rack is provided with receptacles for electronic terminals composed of a plurality of lines for connection to the electronic circuit. Each of these receptacles mates with those terminals, either fixed or unfixed, of the printed circuit which are provided at the underside or rear end of the card-like panel plate. The inner side of each of the two opposing walls of the housing is provided with parallel grooves, and the panel plate is nested in the housing by being fitted into the two opposing parallel grooves. The spacing between adjacent parallel grooves is small, and in order to ensure tight, rather than loose, fitting of the panel plate, frictional holding forces are provided between the inner wall of the groove and the plate. Therefore, a considerable force must be applied to insert the plate into the housing or to extract it from the latter. Furthermore, when a plate is withdrawn from the housing against the frictional holding force, great care must be taken to prevent damage to the adjacent plate. As already mentioned, panel plates nested in the housing are arranged at small spacings, so a new plate must be inserted by pushing one end of the plate toward the bottom or rear end of the housing. When removing one plate, both ends must be pulled up by hands. Before pulling up a panel from the housing, the terminals at the underside or rear end of the plate are disengaged from the receptacle for electronic terminals. Then, the plate is pulled up from the housing. In this procedure, a force is necessary for both disengaging the fitting between the plate and receptacle, and for sliding the plate along the grooves outwardly. This force is relatively strong and provided by holding each corner of one side of the plate by the thumb and the forefinger. Initially, the plate will not slide easily, so a greater force must be applied by the two fingers, and this force sometimes urges the plate surface in such a manner that the plate sliding along the grooves deviates from the groove interior. If this occurs, the plate being withdrawn twists and as a result, the surface of that plate or components on this surface may damage the adjacent plate. Therefore, it involves great difficulty in withdrawing panel plates from the housing.

2. Description of the Prior Art

Conventionally, part of this difficulty is eliminated by a releasing device comprising a riding saddle body with two parallel leg plates, which are slipped over both ends of the top of a panel plate and a pin is inserted through apertures in the leg plates so that the saddle body is pivotally mounted on both ends. An example of this releasing device is shown in U.S. Pat. No. 4,261,076. The device shown in this prior patent is a unitary body comprised of relatively rigid parallel leg plate-like complementary halves interconnected along their common edges by a flexible hinge, one of the parallel leg plate-like portions carrying a pin extending therefrom which mates with an aperture in the opposing complementary half. This device is so designed that when the complementary halves are folded together along the flexible hinge, the pin is forced into the aperture in the opposing complementary half. The process of inserting a plate into the housing proceeds as follows. First, the pin on the unitary body is forced into each of the apertures made in both corners of top side of the plate. Then, one of the opposing complementary halves is folded about the edge of the plate until the pin is forced into the aperture in the other complementary half so as to secure the unitary body on the plate in a pivotable fashion. The inserted plate can be extracted from the housing by the following procedure. First, each of the saddle bodies is pivoted around the pin until that portion of each parallel leg plate which extends beyond the pin contacts the top face of the housing. The resulting force of reaction pushes down the top face of the housing and permits the top side of the panel plate to rise above the housing. Then, the panel plate can be extracted from the housing by lifting its top side with one or both hands. However, if the panel plate being withdrawn twists even slightly, it urges the inner surface of one or both of the complementary halves. If the force of this urging is strong, the complementary halves come apart and the pin slips out of the aperture in one complementary half. As a result, the proper relationship between the panel plate and unitary body is lost, and the unitary member may be disengaged from the plate to destroy the flexible hinge.

Another conventional releasing device is also a riding saddle body having a pair of parallel leg plates that extend in the same direction from the saddle seat and which are spaced apart by a distance substantially equal to the thickness of the panel plate. The portions of the leg plates farther from the saddle seat are provided with a pair of apertures in alignment with each other. As in the first example of the conventional device, this saddle body is fitted over both corners of the front edge of the panel plate in such a manner that the centers of the apertures in the leg plates are aligned with the center of the aperture in the corner of the plate. Before use, a pin is thrusted into these apertures. The manner of using this second conventional type of releasing device is substantially the same as the already shown first type in the form of a unitary body. However, the pin used with the second type of the releasing device is generally smaller both in diameter and length and is liable to become off-centered with the apertures bored in the panel plate and the leg plates of the saddle body. If this loss of axial centering occurs, the pin cannot be hammered into the apertures without bending or breaking. Therefore, great care must be exercised to achieve the complete axial centering between the pin and apertures, and this results in a prolonged saddle mounting operation.

SUMMARY OF THE INVENTION

The present invention is an improvement over the saddle body of the second conventional type and provides a device which is characterized by a saddle body having a pin as its integral part. More specifically, the present invention relates to a locking and releasing device for use with a panel plate comprising a riding saddle body including a saddle seat and a pair of parallel leg plates extending in the same direction from said saddle seat to provide between them a gap which is at least equal to the thickness of the panel plate, each of said leg plates having an aperture bored at a portion remote from the seat, said apertures having the same diameter and being in alignment with each other, the outer surface of one of said leg plates being provided with a pin that outwardly extends from said aperture in a direction normal thereto, the outside diameter of said pin being substantially the same as the inside diameter of the apertures, the length of said pin being substantially the same as the distance between the outer surfaces of said parallel leg plates as intervened by said gap, said pin extending from one of said leg plates in a direction normal thereto in such a manner that said pin is made integral with part of the inner periphery of the aperture by means of thin film strips. According to the present invention, the pin and saddle body form an integral combination, so the two members need not be separately brought to the work site where the device of the present invention is attached to panel plates. This feature of the present invention provides a particularly great advantage in that there is no possibility of inadvertently losing small pins during their transport.

DESCRIPTION OF THE PREFERRED EMBODIMENT

Figure 1:
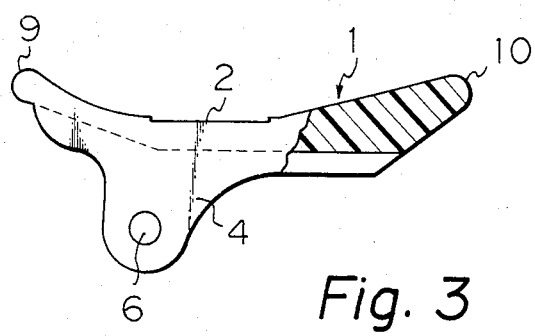
FIG. 1 is a partial cutaway front elevation of the device of the present invention.
Figure 2:
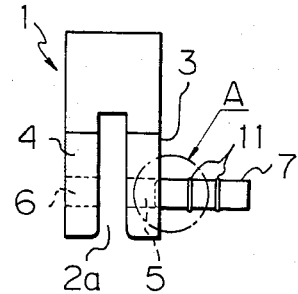
FIG. 2 is a side elevation of FIG. 1 as viewed from the right side.
Figure 3:
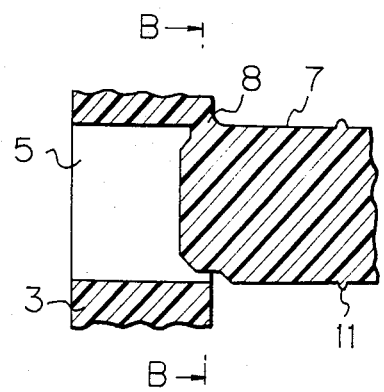
FIG. 3 is an enlarged sectional view of the portion indicated at A in FIG. 2.
Figure 4:
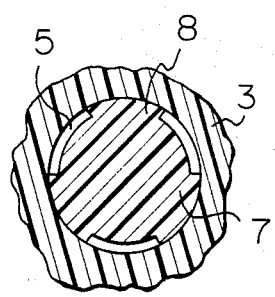
FIG. 4 is a sectional view of FIG. 3 as taken through the line B—B.
Figure 5:
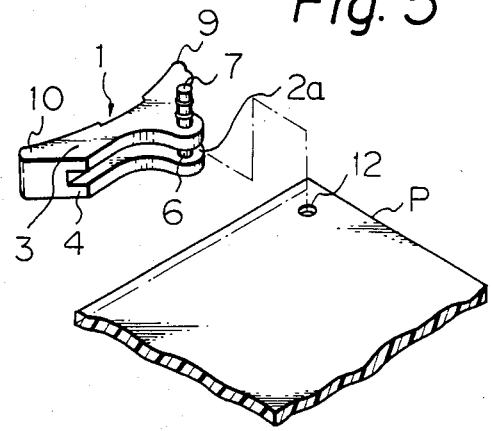
FIG. 5 is a perspective view showing the device of the present invention together with a panel plate.

The saddle body of the present invention as generally indicated by the numeral 1 in FIG. 1 consists of a seat 2 and a pair of parallel leg plates 3 and 4 extending from the seat in the same direction. The distance of gap 2a between the two leg plates is substantially the same as the thickness of a panel plate P. As in the case of a usual saddle seat, the seat 2 of the present invention has a saddle bow 9 and a hind bow 10 linked by a central concave portion. The leg plates 3 and 4 are respectively provided with apertures 5 and 6 of the same diameter at a portion which is off-centered toward the saddle bow and is remote from the seat. The two apertures are in axial alignment with each other. Each leg plate is curved on both sides of the aperture so that it is concave toward the saddle bow and hind bow. Aperture 5 formed in the leg plate 3 is provided with a pin 7 that extends outwardly normal to that leg plate and which is made integral with part of the inner periphery of the aperture by means of thin film strips 8. In FIG. 4, the number of these thin film strips 8 is shown three, but it should be understood that at least two film strips are necessary in the present invention and there is no limitation on the maximum number of the strips. The outside diameter of the pin 7 is substantially the same as the inside diameter of each of the apertures 5 and 6. The length of the pin should be substantially equal to the distance between the outer surfaces of the leg plates. Pin 7 is provided with a pair of ribs 11, 11 in its central portion which surround the pin axis and are spaced apart by the distance equal to the gap 2a between the leg plates. In the embodiment shown, the saddle seat 2 is concave in the center and each of the leg plates is also concave toward both the saddle bow and hind bow. However, the shape of saddle body is not limited to this particular one and other shapes may be employed so long as the underside of the saddle bow 9 can be easily urged against the flange or duct portion of the housing or rack as will be shown later in this specification.

The device of the present invention is used by the following procedure. A panel plate P is inserted into the gap 2a between the leg plates 3 and 4. After bringing an aperture 12 in the corner of the plate into alignment with apertures 5 and 6 in the leg plates, the pin 7 is thrusted into the aperture 6 by striking with, for example, a hammer. The impact of the hammer causes the thin strips 8 supporting the pin 7 to rupture, and as a result, the pin is pushed through the aperture 5 through the aperture 12 until it is supported by the apertures 5 and 6. As already mentioned, the outside diameter of the pin 7 is substantially equal to the inside diameter of each of the apertures 5 and 6, the thrusted pin provides a good fit within these apertures. The thrusted pin is prevented from an axial displacement because the pair of ribs 11 are in contact with the inner surfaces of the opposing leg plates and provide a good fit with the inner periphery of each aperture. As a result of this process, the plate P is loosely fitted with respect to the pin 7 around which the saddle body 1 is pivotally mounted.

Figure 6:
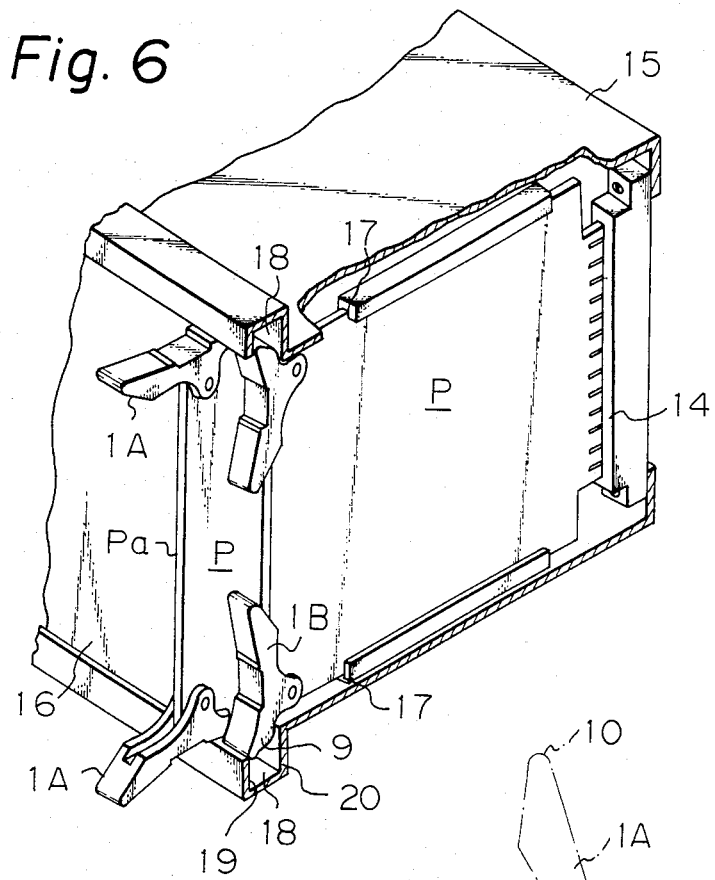
FIGS. 6 and 7 illustrate how the device of the present invention is used, with FIG. 6 being a perspective view and FIG. 7 being a partial elevation showing only one unit of the device.
Figure 7:
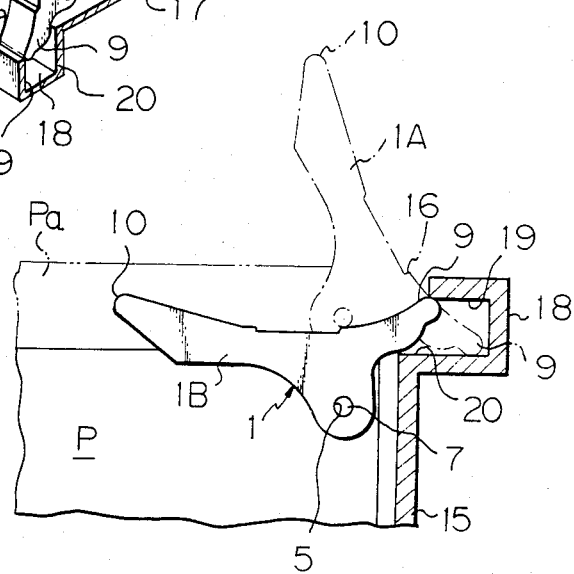

In order to insert the panel plate P into the housing, the device of the present invention is first installed at both corners of the front edge of the plate with the saddle bow facing outwardly. The hind bow is erected as indicated by 1A in FIG. 6, and the plate is slid into the housing or rack 15 from the open end 16 as being guided by grooves 17 provided in the opposite inner walls of the housing. The open end 16 is provided with two opposing ducts 18. When substantially all part of the plate is inserted into the housing and the saddle bow 9 goes beyond the vertical front wall of the duct, the hind bow 10 is turned inwardly (or toward the front edge of the panel) into the position indicated by 1B. Then, the saddle bow 9 contacts the inner surface 19 of the vertical front wall of the duct, and this provides a further push to the plate P until its rear end is inserted into a terminal receptacle 14 as shown in FIG. 6 and FIG. 7 (solid line). In this state, the saddle bow 9 is nested in the channel formed by the duct. In order to withdraw the plate from the housing, the hind bow 10 in its horizontal position 1B is erected to the vertical position indicated by 1A (FIG. 7). Then, the saddle bow 9 pushes the inner surface of the other vertical wall 20 of the duct, thereby releasing the plate to shift to the position indicated by Pa in FIG. 7 (phantom line).

As will be apparent from the foregoing description, the device of the present invention can be attached to the plate by simplying hammering the pin into the apertures 5 and 6 in the leg plates in alignment with the aperture 12 in the plate. Before thrusting into the apertures, the pin is integral with the aperture in one leg plate, and therefore, once the aperture in the other leg plate is brought into alignment with the aperture 12 in the plate, the pin can be immediately hammered into the apertures. Therefore, the device of the present invention can be attached to the panel plate very easily and precisely.

Because of the pair of ribs 11 that contact the inner surfaces of the two opposing leg plates 3 and 4, the pin is firmly supported by the apertures 5 and 6 and is prevented from any axial displacement. The parallel leg plates 3 and 4 that extend from the seat 2 of the saddle body 1 form a rigid body with the saddle body, so the width of the gap 2a between the leg plates will not change during use of the device. During insertion or withdrawal of the panel plate P as pivotally supported between the leg plates, it may move irregularly within grooves in the housing and one or both sides of the plate may urge against the inner surface of the leg plates. However, because of the rigidity of the with of the gap 2a, the plate will not press the seat 2 in an inclined manner. This prevents the panel plate within the grooves from undergoing an angular displacement from its normal relation with respect to the axis of the pin 7. Should such displacement occur, the pin will not slip out of the panel plate.

What is claimed is:

1. A locking and releasing device for use with a panel plate comprising a riding saddle body including a saddle seat and a pair of parallel leg plates extending in the same direction from said saddle seat to provide a gap therebetween which is at least equal to the thickness of the panel plate, each of said leg plates having an aperture bored at a portion remote from the seat, said apertures having the same diameter and being in alignment with each other, the outer surface of one of said leg plates being provided with a pin that extends from said aperture in a direction normal thereto, the outside diameter of said pin being substantially the same as the inside diameter of the apertures, the length of said pin being substantially the same as the distance between the outer surfaces of said parallel leg plates, said pin extending from one of said leg plates in a direction normal thereto in such a manner that said pin is made integral with part of the inner periphery of the aperture by means of thin film strips.

2. A locking and releasing device as set forth in claim 1, wherein said pin is provided with a pair of ribs formed therearound which are spaced apart by the distance which is substantially equal to the width of the gap between said leg plates.

3. A locking and releasing device as set forth in claim 1, wherein each of said apertures in the leg plates is off-centered toward the saddle bow of said seat.

4. A locking and releasing device for use with a panel plate, comprising:
   a riding saddle body including a saddle seat and a pair of parallel leg plates extending in the same direction from said saddle seat to provide a gap therebetween which is at least equal to the thickness of the panel plate,
   each of said leg plates having an aperture bored at a portion remote from the seat and which is off-centered toward the saddle bow of said seat,
   said apertures having the same diameter and being in alignment with each other, the outer surface of one of said leg plates being provided with a pin that extends from said aperture in a direction normal thereto, the outside diameter of said pin being substantially the same as the inside diameter of the apertures, the length of said pin being substantially the same as the distance between the outer surfaces of said parallel leg plates, said pin extending from one of said leg plates in a direction normal thereto in such a manner that said pin is made integral with part of the inner periphery of the aperture by means of thin film strips,
   said pin being provided with a pair of ribs formed therearound which are spaced apart by a distance which is substantially equal to the width of the gap between said leg plates.

* * * * *